(12) United States Patent
Van Veldhoven et al.

(10) Patent No.: US 7,564,396 B2
(45) Date of Patent: Jul. 21, 2009

(54) SIGNAL RECEIVER AND MOBILE COMMUNICATION DEVICE FOR ISOLATING A DESIRED SIGNAL THAT IS SUSCEPTIBLE TO VARIATIONS IN SIGNAL POWER

(75) Inventors: Robert Henrikus Margaretha Van Veldhoven, Dommelen (NL); Lucien Johannes Breems, Eindhoven (NL)

(73) Assignee: NXP B.V., Eindhoven (NL)

( * ) Notice: Subject to any disclaimer, the term of this patent is extended or adjusted under 35 U.S.C. 154(b) by 125 days.

(21) Appl. No.: 11/577,499

(22) PCT Filed: Oct. 11, 2005

(86) PCT No.: PCT/IB2005/053344

§ 371 (c)(1),
(2), (4) Date: Apr. 18, 2007

(87) PCT Pub. No.: WO2006/043207

PCT Pub. Date: Apr. 27, 2006

(65) Prior Publication Data

US 2008/0218392 A1 Sep. 11, 2008

(30) Foreign Application Priority Data

Oct. 18, 2004 (EP) .................................. 04300685

(51) Int. Cl.
*H03M 1/38* (2006.01)
(52) U.S. Cl. ....................................... 341/161; 341/155
(58) Field of Classification Search .......... 341/130–160
See application file for complete search history.

(56) References Cited

U.S. PATENT DOCUMENTS

| 5,684,850 | A | * | 11/1997 | Warburton et al. | ............ | 378/53 |
| 5,774,522 | A | * | 6/1998 | Warburton | .................... | 378/91 |
| 6,005,901 | A | * | 12/1999 | Linz | ........................... | 375/355 |
| 6,134,430 | A | | 10/2000 | Younis et al. | | |
| 6,185,460 | B1 | * | 2/2001 | Thompson | .................... | 607/16 |
| 6,438,422 | B1 | * | 8/2002 | Schu et al. | ..................... | 607/16 |

FOREIGN PATENT DOCUMENTS

WO 9930427 6/1999

\* cited by examiner

*Primary Examiner*—Lam T Mai

(57) ABSTRACT

A signal receiver processing circuit for isolating a desired signal from an analog input signal that is susceptible to variations in signal power, e.g. from a radio front end, includes a variable gain amplifier, an analog to digital converter, a digital signal processor, and a control unit. The analog to digital converter provides a digital signal to the digital signal processor. The digital signal processor includes a digital filter. The control unit adjusts a filtering accuracy of the analog to digital converter and/or the digital signal processor unit in dependence of a signal quality of the input signal.

19 Claims, 6 Drawing Sheets

Figure 1:
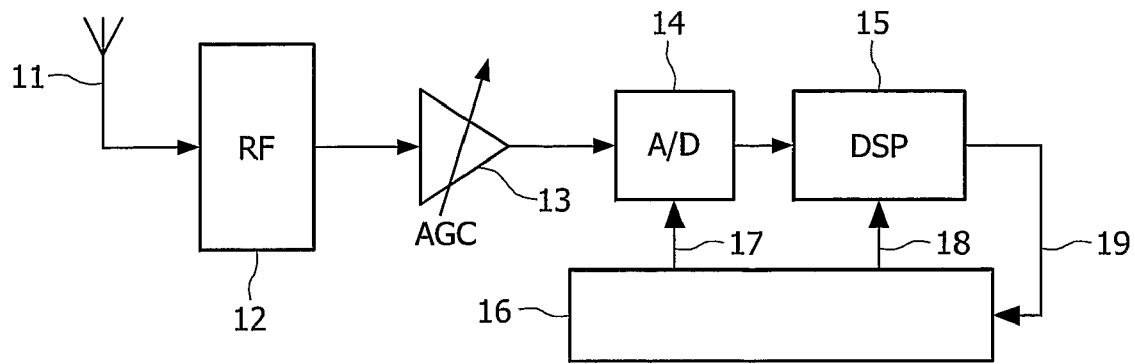

SIGNAL RECEIVER AND MOBILE COMMUNICATION DEVICE FOR ISOLATING A DESIRED SIGNAL THAT IS SUSCEPTIBLE TO VARIATIONS IN SIGNAL POWER

The invention relates to a device for digitally processing an analog input signal for isolating a desired signal that is susceptible to variations in signal power.

The invention further relates to a communication device comprising the device for digitally processing the analog input signal.

The invention relates to the field of analog to digital conversion for digital signal processing, and in particular to, in a signal receiver, adjusting the dynamic range for isolating a desired signal from a received input signal at reduced power consumption.

The document WO99/30427 describes a programmable dynamic range receiver including an analog to digital converter (ADC), in particular a converter of a sigma-delta (ΣΔ) type in a digital communications receiver device. In such a communications system a signal receiver receives an analog input signal that is susceptible to variations in signal power, which input signal comprises an information signal component to be isolated from further signal components. A programmable dynamic range receiver is described which provides the requisite level of performance at reduced power consumption. The ΣΔ ADC within the receiver is designed with multiple loops. Each loop provides a predetermined dynamic range performance. The loops can be enabled or disabled based on the required dynamic range and a set of dynamic range thresholds. The ΣΔ ADC may also be designed with adjustable bias current. The dynamic range of the ΣΔ ADC varies approximately proportional to the bias current. By adjusting the bias current, the required dynamic range can be provided by the ΣΔ ADC with minimal power consumption. A reference voltage of the ΣΔ ADC can be decreased when high dynamic range is not required, thereby allowing for less bias current in the ΣΔ ADC and supporting circuitry. The dynamic range of the ΣΔ ADC is also a function of an oversampling ratio which is proportional to the sampling frequency. High dynamic range requires a high oversampling ratio. When high dynamic range is not required, the sampling frequency can be lowered. Also the dynamic range of the ΣΔ A/D converter may be set in dependence of the operating mode of the receiver device. However, the known ways of adjusting the dynamic range are not sufficiently flexible and accurate, and may require additional circuitry.

It is an object of the invention to provide a device for digitally processing an analog input signal having a flexible way of adapting the dynamic range to the quality of the input signal for reducing the power consumption.

For this purpose, according to a first aspect of the invention the device for digitally processing an analog input signal as described in the opening paragraph comprises an analog to digital converter for converting the analog input signal to a digital signal to be processed, and a digital signal processor for digitally processing the digital signal from the analog to digital converter, the digital signal processor including a digital filter, and a control unit for adjusting a filtering accuracy of at least one of the analog to digital converter and the digital signal processor unit in dependence of a signal quality of the input signal.

For this purpose, according to a second aspect of the invention the communication device as described in the opening paragraph comprises the above device for digitally processing an analog input signal and a receiving unit for providing the analog input signal.

The measures have the effect that the input signal is conditioned by applying a filtering accuracy that is adapted to the quality of the input signal. Thereby a high complexity filtering is set for a weak input signal or a high level of noise or interference, whereas a low complexity filtering is set for a clear, strong and high quality input signal. Advantageously the amount of power needed for the filtering is reduced for higher quality input signals.

The invention is also based on the following recognition. In the known solutions the signals are commonly either manipulated in the analog domain by adjusting the reference voltage of the ADC or by switching off a loop of a multi-loop ΣΔ ADC, or by adjusting the speed of operation of the ΣΔ ADC by adjusting the bias current or adapting the sampling frequency. However, the inventors have seen that a more flexible tool for adjusting the dynamic range and reducing power consumption is made available by adjusting the filtering accuracy, for example by adjusting the order of a filter in the ADC or in the digital signal processor, or setting accuracy by adapting the number of bits of the digital words representing the signal.

In an embodiment of the device the analog to digital converter includes a loop comprising a loop filter, and the control unit is arranged for adjusting the filtering accuracy of the loop filter. In a particular embodiment the loop filter comprises a sequence of a number of loop units constituting a loop filter of a filtering order related to the number of loop units, and the control unit is arranged for adjusting the filtering accuracy of the loop filter by adjusting the filtering order by activating or deactivating at least one loop unit. This has the advantage that a complex high order loop filter is available in the analog to digital converter for coping with adverse input signal conditions, whereas the order of the filter can be easily reduced for medium or high quality input signals, which significantly reduced the power consumption.

In an embodiment of the device the control unit is arranged for adjusting the filtering accuracy by activating or deactivating at least one filter section in the digital filter in the digital signal processor. The filter sections may comprise digital integrators, multipliers, delay lines, and so on. The inventors have seen that the digital processing requires relatively much power when operated at full capacity. Reducing the number of sections or filtering steps reduces the required processing capacity. This has the advantage that this allows the digital signal processor to be operated at lower clock speeds, or to be temporarily switched to a standby mode.

In an embodiment of the device the control unit is arranged for adjusting the filtering accuracy by adjusting a number of bits of words representing values of the digital signal to be processed in the digital filter. The inventors have seen that the digital processing requires relatively much power when operated at full capacity. Reducing the number of bits allows the digital signal processor to operate at lower processing capacity, which advantageously reduces the required power consumption.

Further preferred embodiments of devices according to the invention are given in the appended claims, disclosure of which is incorporated herein by reference.

Figure 2:
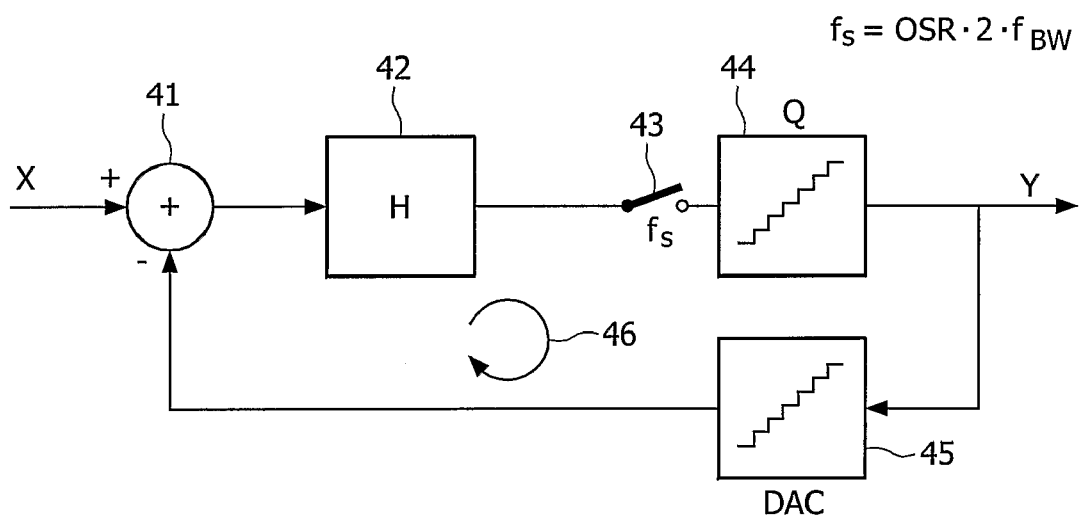
Figure 3:
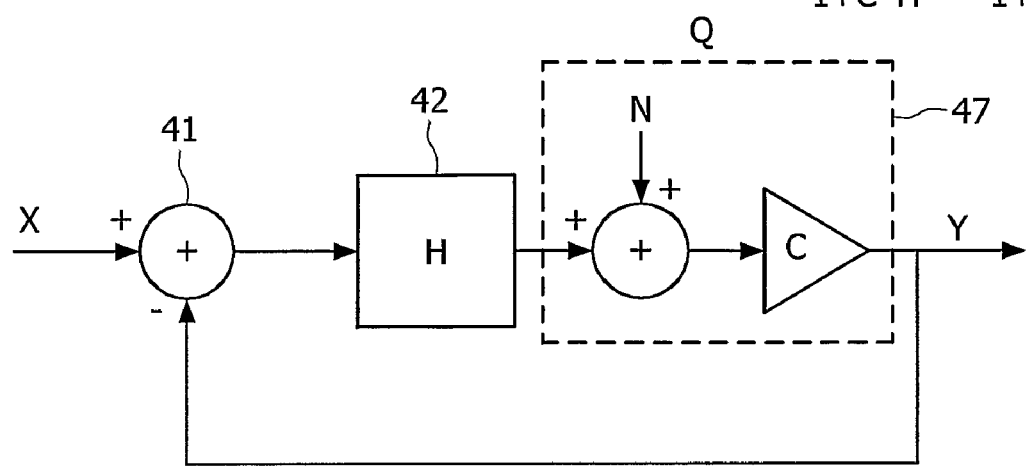
Figure 4:
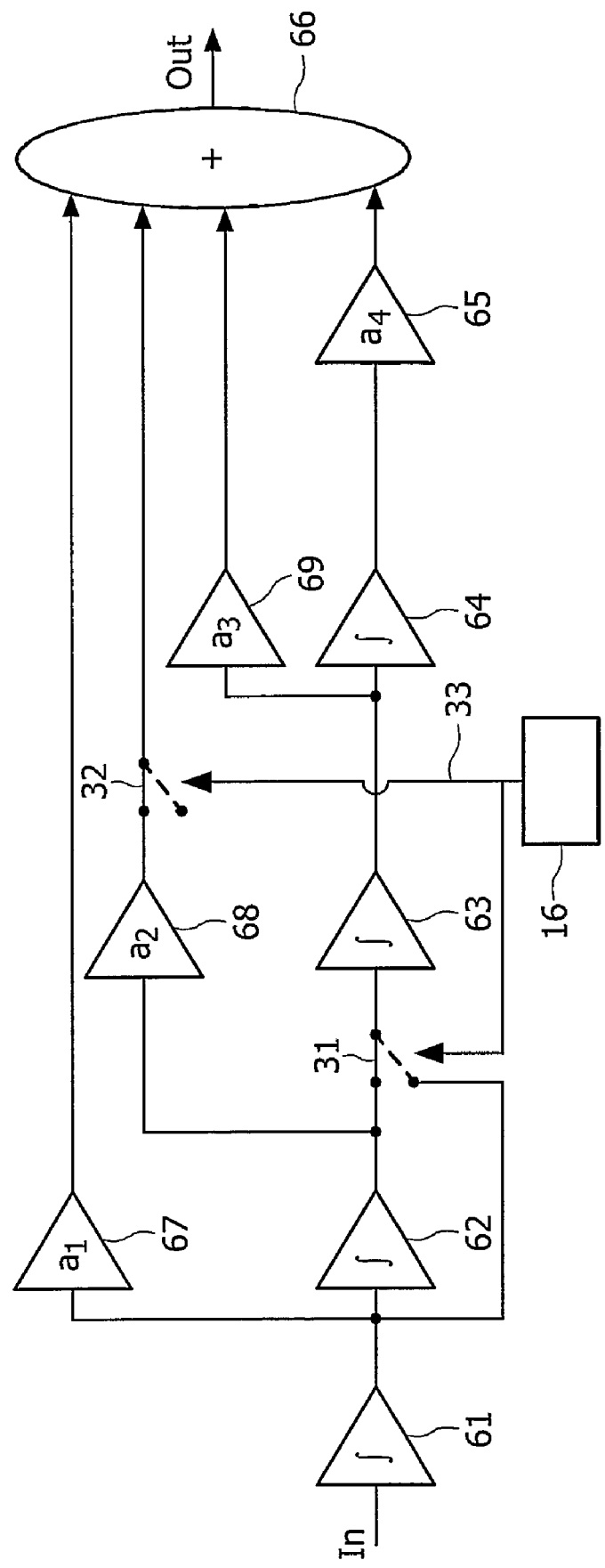
Figure 5:
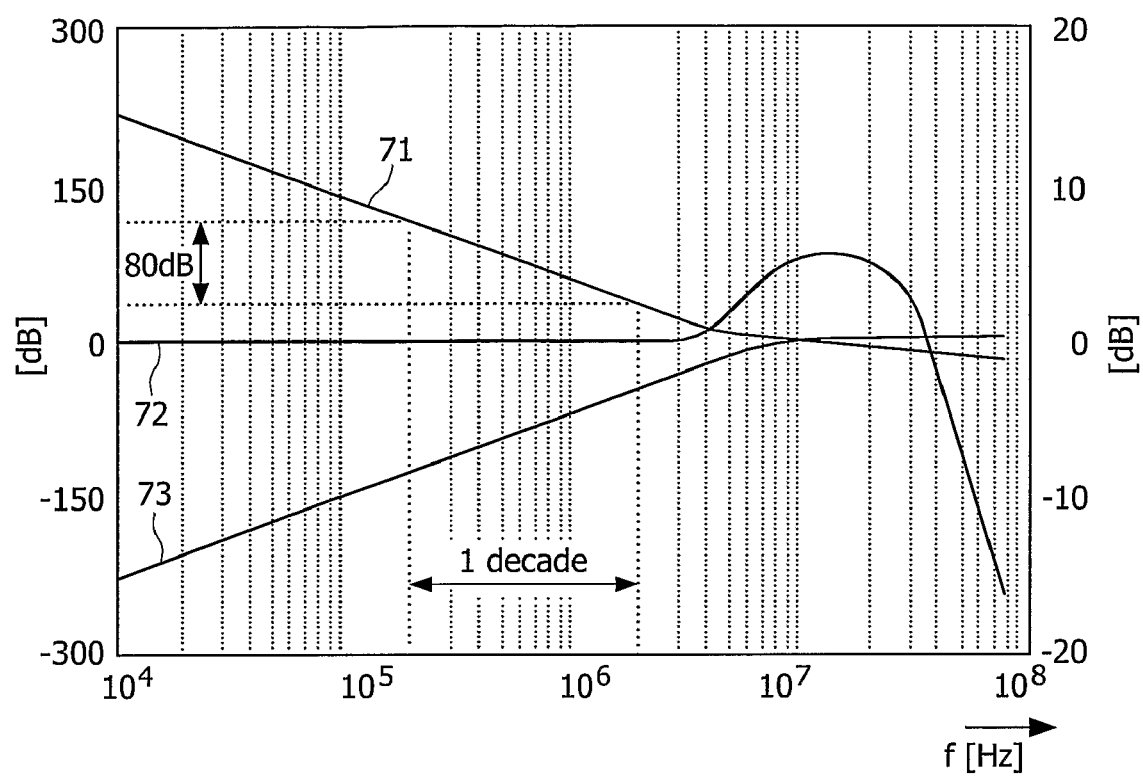
Figure 6:
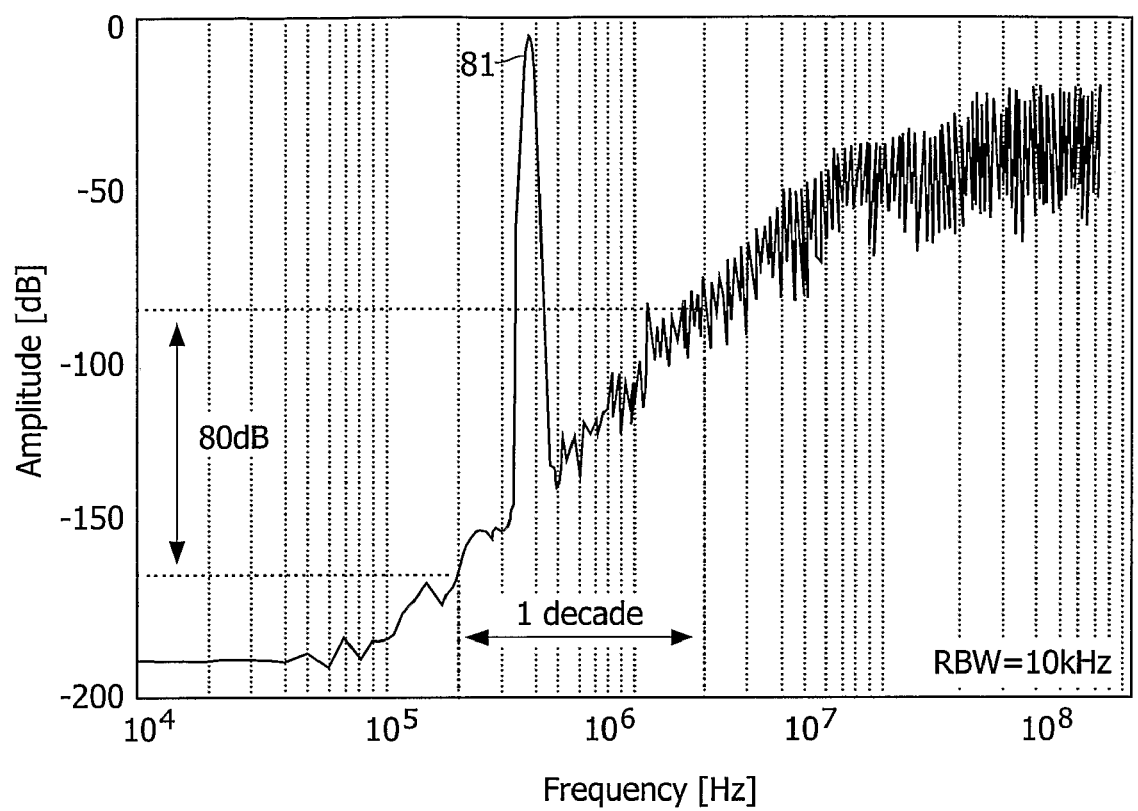
Figure 7:
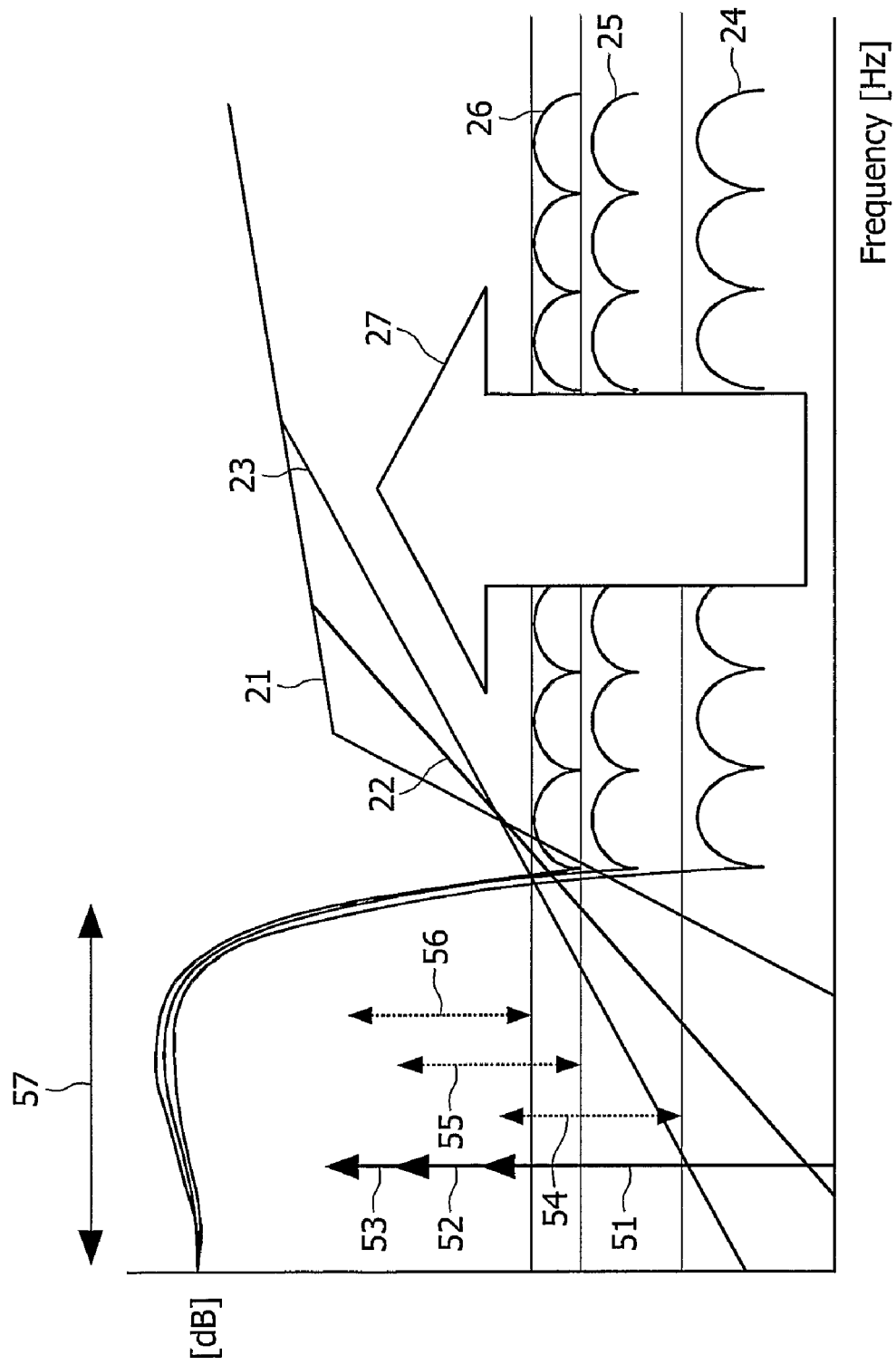

These and other aspects of the invention will be apparent from and elucidated further with reference to the embodiments described by way of example in the following description and with reference to the accompanying drawings, in which FIG. 1 shows a diagram of a receiver device having adjustable filtering accuracy, FIG. 2 shows a sigma-delta analog to digital converter, FIG. 3 shows a detailed model of a sigma-delta analog to digital converter, FIG. 4 shows a loop filter having adjustable filtering accuracy for use in an analog to digital converter, and FIG. 5 shows transfer functions of a loop filter and sigma delta modulator closed loop transfer, FIG. 6 shows an output spectrum of a sigma delta converter, and FIG. 7 shows an input signal and a transfer function at different filter accuracies.

Corresponding elements in different Figures have identical reference numerals.

FIG. 1 shows a diagram of a receiver device having adjustable filtering accuracy. The device has an antenna 11 coupled to a radio frequency front end 12. The analog signal from the front end 12 is coupled to an amplifier 13 having an automatic gain control, e.g. by measuring the signal power in an analog signal strength detector circuit at the output of the amplifier 13. The amplifier provides the amplified analog signal to an analog to digital converter 14 (ADC), which provides a digital signal to the digital signal processor 15. The digital signal processor includes a digital filter for isolating the desired signal from the input signal received at the input. In such digitized receiver architectures the ADC is present somewhere in the receiver chain to convert the information signal of a wanted channel into the digital domain. This digitization leads to more flexible receiver architecture, e.g. channel filtering and demodulation can be done in the digital domain. The RF front-end 12 in the Figure converts received radio signal including the wanted channel to an IF frequency (which may be zero), and also does preparatory signal conditioning such as amplification and channel filtering to attenuate neighboring channels and interferers. If the signal strength of the wanted channel is only small or too big, the AGC amplifier 13 is used to amplify or attenuate the incoming signal to condition it in such a way it can be converted into the digital domain properly. This means that the wanted signal is put at as close as possible to the maximum input level of the ADC, causing the noise contribution of the ADC to be as low as possible.

In handsets for mobile communication, and other communication devices like TV, there is a trend to shift the ADC closer to the antenna, in order to move analog functional blocks such as filters and amplifiers into the digital domain. This way a more flexible system with higher level of integration is obtained, as well as lower cost and reduced component count.

Another trend in the telecom market is the ability to receive multiple communication standards (such as GSM, EDGE, CDMA, and UMTS) with the same receiver chip. The different standards have different bandwidths and dynamic range requirements. As a result of these trends, an ADC and the subsequent signal processing is required that is able to handle all these bandwidth and dynamic range requirements.

Moreover, a problem of shifting the ADC closer to the antenna is the increasing input dynamic range for the ADC. The ADC now has to cope with large interfering signals, which in more conventional receiver architectures are eliminated by the analog pre-filtering. Even the range of the automatic gain control amplifier 13 may be limited, or the variable gain control may be transferred to the ADC or the digital domain. Hence the dynamic range requirements also apply for the digital filters, which become area and power consuming. In portable battery powered applications, e.g. a mobile phone, low power consumption is very important to increase stand-by time.

According to the invention a way of dealing with the above problem is to adapt the dynamic range of the signal processing by making one or more of the various filters in the signal processing device scalable. The dynamic range of the ADC is set by adapting the filtering accuracy to convert the input signal into the digital domain in such a way that interferers do not harm the signal integrity in the receiver chain, and an acceptable Bit Error Rate can be achieved. In the absence of large interferers or neighboring channels, the dynamic range of ADC and/or digital filtering is reduced, which saves power. In this case the wanted channel is easily isolated by the ADC and digital filtering. When an interferer pops up, the ADC and digital filtering is set to its full dynamic range and filtering complexity and after determining the magnitude of the interferer, the dynamic range of the signal processing is scaled down again to save power.

The problem is how to adapt the dynamic range of the signal processing by the analog to digital converter and the digital signal processor to different quality of the input signal. Thereto the device includes a control unit 16 for adjusting a filtering accuracy of the signal processing in the analog to digital converter 14 via an analog filter control signal 17 and/or in the digital signal processor 15 via a digital filter control signal 18. The control unit 16 is coupled to the digital signal processor 15 for receiving a quality signal 19 indicative of a signal quality of the input signal. The signal quality may be the signal power of the desired signal, an interference level of other signals with respect to the input signal, a noise level, etc. The control unit detects the signal quality and adjusts the filtering accuracy by adjusting the order of one or more filters or by adjusting the calculating accuracy of the digital filtering as described below in detail. It is noted that also the AGC amplifier 13 may be controlled by a digital control signal from the control unit 16. The first option for adapting the filtering accuracy is adjusting a loop filter order in the analog to digital converter.

FIG. 2 shows a sigma-delta analog to digital converter. The sigma delta converter includes a loop filter 42 having a transfer function H, a quantizer Q after a sample unit 43 that samples the analog signal at sample frequency $f_s$ to provide an output signal Y. The sample frequency is set by:

$$f_s = OSR \cdot 2 \cdot f_{BW}$$

wherein OSR indicates output sample rate and $f_{BW}$ indicates the required bandwidth. The loop provides feedback via a digital to analog converter (DAC) 45 and a summing node 41 receiving an input signal X and a feedback signal from the loop via DAC 45. The sigma delta modulator provides noise shaping to suppress quantization noise in the signal bandwidth, while leaving the input signal unharmed, as shown below in FIG. 6.

FIG. 3 shows a detailed model of a sigma-delta analog to digital converter. Like in FIG. 2 an input node 41 and a loop filter 42 are provided, while feedback of the digital output signal Y to the input node 41 is shown by a direct connection. A model of a quantizer Q 47 is given in detail as a noise source N and a gain factor C. The output Y is subsequently defined by:

$$Y = \frac{C \cdot H}{1 + C \cdot H} X + \frac{C}{1 + C \cdot H} N$$

It is noted that, if C·H is sufficiently high, the output signal Y equal the input signal X and an additional noise component shaped by 1/H, i.e. by the loop filter as shown by a specific example in FIG. 4.

FIG. 4 shows a loop filter having adjustable filtering accuracy for use in an analog to digital converter. The loop filter comprises a sequence of loop units, i.e. integrator units 61,62, 63,64 connected in series. The output of each integrator unit is coupled via a respective amplifying unit 67,68,69,65 to a sum unit 66. The amplifying coefficient of each amplifying unit 67,68,69,65 is indicated by $a_1$, $a_2$, $a_3$, $a_4$ respectively. A switching unit 31 is coupled to the second loop filter unit 62, and switches either the output signal of the first loop unit 61 or the output signal of the second output unit 62 to the input of the third loop unit 63. A second switching unit 32 is provided to connect or disconnect the output of the second amplifying unit 68 to the summing unit 66. Both switching units 31,32 are controlled for bypassing the second loop unit 62 and corresponding amplifying unit 68 by a filter accuracy signal 33 provided by the control unit 16 in dependence of the signal quality. It is noted that a different loop unit, or one or more further loop units and amplifying units may also be provided with similar switching units for activating and/or deactivating the respective loop units. The switching units are arranged for actually reducing the power consumption of the units that are deactivated or bypassed, preferably reducing the remaining power consumption to a zero value.

The loop filter in this example is of the $4^{th}$ order, and consists of integrators and feed forward coefficients as indicated. The number of integrators determines the order of the noise shaping. By the switching units the order of the filer is adapted, for example to a $3^{rd}$ order filter as described above. It is noted that other filters may be used also, e.g. band-pass filters or more complex filter architectures. An example of the resulting transfer function is given below with reference to FIG. 7.

FIG. 5 shows transfer functions of a loop filter and sigma delta modulator closed loop transfer. The loop filter transfer function is indicated by the upper curve 71 having a clear low pass character, the horizontal axis indicating frequency and the vertical axis indicating the response (gain in dB indicated on the left vertical axis). The fourth order of the loop filter corresponds to the gain difference of 80 dB for a decade as shown in the Figure. A signal transfer function STF is indicated by a curve 72, and based on:

$$STF_{c1} = \frac{Y}{X} = \frac{C \cdot H}{1 + C \cdot H}$$

The noise shaping transfer function NTF is indicated by curve 73, and based on.

$$NTF_{c1} = \frac{Y}{N} = \frac{C}{1 + C \cdot H}$$

As can be seen from the Figure the sigma delta modulator uses noise shaping to suppress quantization noise in the signal bandwidth, while leaving the input signal unharmed.

FIG. 6 shows an output spectrum of a sigma delta converter. The horizontal axis indicates frequency and the vertical axis indicates the response of an analog digital converter. The bandwidth (RBW) used for the spectrum is 10 kHz. The noise shaping as described above for an input signal containing a desired information channel is shown by the converted input signal curve 81. Again the noise shaping of a fourth order loop filter is visible from the gain difference of 80 dB for a decade. Adapting the filtering accuracy for scaling the dynamic range can be implemented in such sigma delta modulators and/or in the decimation and further channel filters in the digital signal processing.

FIG. 7 shows an input signal and a transfer function at different filter accuracies. The order of the loop filter in the sigma modulator is adapted to the dynamic range required. The effect on the transfer function of the digital filter is shown in the Figure as follows. A bandwidth 57 is determined by a filter having a high order indicated by lower curve 24, a medium filter order indicated by lower middle curve 25, and a low order filter indicated by upper curve 26. The large arrow 27 indicates the effect that the noise floor is scaled upwards which effectively determines the dynamic range. A first desired signal 51 is of a low quality and requires a dynamic range 54 at the low noise floor of curve 24. A second desired signal 52 is of a medium quality and requires a dynamic range 55 at the middle noise floor of the middle curve 25. A third desired signal 53 is of a high quality and allows a dynamic range 56 at the high noise floor of the upper curve 26. Hence, if the desired signal has sufficient quality, i.e. is strong enough with respect to the noise, the digital filter needs a lower suppression for out of band interferers or neighbouring channels, and the filter activated is simpler and results in lower power consumption.

It is to be noted that the methods described above also work for devices having other ADC topologies such as band pass sigma delta modulators, Nyquist converters and so on. For example the filter in the ADC may contain further integrator or resonator section, and further feedback or feedforward units having adjustable gain coefficients. Many suitable filtering architectures are known in the art, for example from the handbook "Delta-Sigma Data Converters, Theory, Design, and Simulation" Steven R. Norsworthy et. al. ISBN 0-7803-1045-4. The filtering accuracy of the applied filter circuits can be adjusted in a required way, for example by adapting the band pass characteristics by setting the required number of sections and/or adjusting the gain coefficients.

In an embodiment, alternatively or additionally to scaling the loop filter order in the sigma delta modulator or the filtering accuracy in the ADC of another type, the digital filtering is adjusted to the signal quality and dynamic range it has to deal with. The digital filter may be a finite impulse response filter having a number of sections and corresponding filtering coefficients. The control unit 16 is arranged for adjusting the filtering accuracy by adjusting the number of sections and/or a number of bits. i.e. the digital accuracy, of the filter coefficients. The transfer function may be adjusted by setting the number of active filter sections in the digital filter. Furthermore the number of bits for calculating the signal values may be adapted. In a practical embodiment the digital filter may be implemented in signal processing software, and the adjusting of the filtering accuracy may be implemented by selecting the appropriate software function or parameter settings.

Due to the reduction of quantization noise suppression in the digital filter, e.g. by limiting the width of the digital words, more quantization noise will fold back to the signal bandwidth, which decreases the dynamic range of the receive path, but as for a high quality input signal there are no interferers or neighboring channels, this is allowed.

Although the invention has been explained mainly by embodiments based on sigma delta type analog to digital converters having loop filters, it is noted that the invention may be implemented using any type of analog to digital

The invention claimed is:

1. Device for digitally processing an analog input signal for isolating a desired signal that is susceptible to variations in signal power, the device comprising
   an analog to digital converter for converting the analog input signal to a digital signal to be processed,
   a digital signal processor for digitally processing the digital signal from the analog to digital converter, the digital signal processor including a digital filter, and
   a control unit for adjusting a filtering accuracy of at least one of the analog to digital converter and the digital signal processor unit in dependence of a signal quality of the input signal,
   wherein the analog to digital converter includes a loop comprising a loop filter, and the control unit is arranged for adjusting the filtering accuracy of the loop filter, wherein the loop filter comprises a sequence of a number of loop units constituting a loop filter of a filtering order related to the number of loop units, and the control unit is arranged for adjusting the filtering accuracy of the loop filter by adjusting the filtering order by activating or deactivating at least one loop unit.

2. Device as claimed in claim 1, wherein the sequence of loop units comprises integrators and feed forward units, and the control unit is arranged to deactivate or activate at least one integrator and subsequently adapting at least one of the feed forward units.

3. Device as claimed in claim 1, wherein the analog to digital converter is a sigma-delta converter and the loop comprises an analog loop filter coupled to a quantizer.

4. Device as claimed in claim 1, wherein the control unit is arranged for adjusting the filtering accuracy by activating or deactivating at least one filter section in the digital filter in the digital signal processor.

5. Device as claimed in claim 4, wherein the digital filter has a number of sections and corresponding filtering coefficients, and the control unit is arranged for adjusting the filtering accuracy by adjusting the number of sections and/or a number of bits of the filter coefficients.

6. Device as claimed in claim 1, wherein the control unit is arranged for adjusting the filtering accuracy by adjusting a number of bits of words representing values of the digital signal to be processed in the digital filter.

7. Device as claimed in claim 1, wherein the control unit is arranged for detecting a signal power or an interference level as the signal quality of the input signal.

8. Communication device, the device comprising a device for digitally processing an analog input signal as claimed claim 1, and a receiving unit for providing the analog input signal.

9. Device for digitally processing an analog input signal for isolating a desired signal that is susceptible to variations in signal power, the device comprising
   an analog to digital converter for converting the analog input signal to a digital signal to be processed,
   a digital signal processor for digitally processing the digital signal from the analog to digital converter, the digital signal processor including a digital filter, and
   a control unit for adjusting a filtering accuracy of at least one of the analog to digital converter and the digital signal processor unit in dependence of a signal quality of the input signal,
   wherein the control unit is arranged for adjusting the filtering accuracy by activating or deactivating at least one filter section in the digital filter in the digital signal processor, wherein the digital filter has a number of sections and corresponding filtering coefficients, and the control unit is arranged for adjusting the filtering accuracy by adjusting the number of sections and/or a number of bits of the filter coefficients.

10. Device as claimed in claim 9, wherein the analog to digital converter includes a loop comprising a loop filter, and the control unit is arranged for adjusting the filtering accuracy of the loop filter.

11. Device as claimed in claim 10, wherein the loop filter comprises a sequence of a number of loop units constituting a loop filter of a filtering order related to the number of loop units, and the control unit is arranged for adjusting the filtering accuracy of the loop filter by adjusting the filtering order by activating or deactivating at least one loop unit.

12. Device as claimed in claim 11, wherein the sequence of loop units comprises integrators and feed forward units, and the control unit is arranged to deactivate or activate at least one integrator and subsequently adapting at least one of the feed forward units.

13. Device as claimed in claim 10, wherein the analog to digital converter is a sigma-delta converter and the loop comprises an analog loop filter coupled to a quantizer.

14. Device as claimed in claim 9, wherein the control unit is arranged for adjusting the filtering accuracy by adjusting a number of bits of words representing values of the digital signal to be processed in the digital filter.

15. Device as claimed in claim 9, wherein the control unit is arranged for detecting a signal power or an interference level as the signal quality of the input signal.

16. Communication device, the device comprising a device for digitally processing an analog input signal as claimed claim 9, and a receiving unit for providing the analog input signal.

17. Device for digitally processing an analog input signal for isolating a desired signal that is susceptible to variations in signal power, the device comprising
   an analog to digital converter for converting the analog input signal to a digital signal to be processed,
   a digital signal processor for digitally processing the digital signal from the analog to digital converter, the digital signal processor including a digital filter, wherein the digital filter is a finite response filter, and
   a control unit for adjusting a filtering accuracy of at least one of the analog to digital converter and the digital signal processor unit in dependence of a signal quality of the input signal; and
   wherein the analog to digital converter includes a loop comprising a loop filter, and the control unit is arranged for adjusting the filtering accuracy of the loop filter, wherein the loop filter comprises a sequence of a number of loop units constituting a loop filter of a filtering order related to the number of loop units, and the control unit is arranged for adjusting the filtering accuracy of the loop filter by adjusting the filtering order by activating or deactivating at least one loop unit.

18. Device as claimed in claim 17, wherein the sequence of loop units comprises integrators and feed forward units, and the control unit is arranged to deactivate or activate at least one integrator and subsequently adapting at least one of the feed forward units.

19. Device as claimed in claim 17, wherein the control unit is arranged for adjusting the filtering accuracy by activating or deactivating at least one filter section in the digital filter in the digital signal processor, wherein the digital filter has a number of sections and corresponding filtering coefficients, and the control unit is arranged for adjusting the filtering accuracy by adjusting the number of sections and/or a number of bits of the filter coefficients.

* * * * *